(12) United States Patent
Pagaila et al.

(10) Patent No.: US 10,643,952 B2
(45) Date of Patent: May 5, 2020

(54) SEMICONDUCTOR DEVICE AND METHOD OF FORMING EMI SHIELDING LAYER WITH CONDUCTIVE MATERIAL AROUND SEMICONDUCTOR DIE

(71) Applicant: JCET Semiconductor (Shaoxing) Co., Ltd., Shaoxing (CN)

(72) Inventors: Reza A. Pagaila, Tangerang (ID); Flynn Carson, Redwood City, CA (US); Seung Uk Yoon, Singapore (SG)

(73) Assignee: JCET Semiconductor (Shaoxing) Co., Ltd. (CN)

( * ) Notice: Subject to any disclaimer, the term of this patent is extended or adjusted under 35 U.S.C. 154(b) by 11 days.

(21) Appl. No.: 15/280,632

(22) Filed: Sep. 29, 2016

(65) Prior Publication Data

US 2017/0018507 A1 Jan. 19, 2017

Related U.S. Application Data

(63) Continuation of application No. 12/792,031, filed on Jun. 2, 2010, now Pat. No. 9,484,279.

(51) Int. Cl.
*H01L 23/552* (2006.01)
*H01L 21/56* (2006.01)
(Continued)

(52) U.S. Cl.
CPC ........ *H01L 23/552* (2013.01); *H01L 21/4871* (2013.01); *H01L 21/561* (2013.01); *H01L 21/568* (2013.01); *H01L 23/06* (2013.01); *H01L 23/10* (2013.01); *H01L 23/3128* (2013.01); *H01L 23/3135* (2013.01); *H01L 23/5286* (2013.01); *H01L 24/02* (2013.01); *H01L 24/19* (2013.01); *H01L 24/95* (2013.01); *H01L 24/96* (2013.01); *H01L 25/0657* (2013.01); *H01L 25/115* (2013.01); *H01L 23/5389* (2013.01); *H01L 24/11* (2013.01); *H01L 24/13* (2013.01);
(Continued)

(58) Field of Classification Search
CPC .......................... H01L 23/552; H01L 23/3135
See application file for complete search history.

(56) References Cited

U.S. PATENT DOCUMENTS 5,250,843 A 10/1993 Eichelberger
5,353,498 A 10/1994 Fillion et al.
(Continued)

*Primary Examiner* — Peter Bradford
(74) *Attorney, Agent, or Firm* — Robert D. Atkins; Patent Law Group: Atkins and Associates, P.C.

(57) ABSTRACT

A semiconductor device has a plurality of first semiconductor die mounted over an interface layer formed over a temporary carrier. An encapsulant is deposited over the first die and carrier. A flat shielding layer is formed over the encapsulant. A channel is formed through the shielding layer and encapsulant down to the interface layer. A conductive material is deposited in the channel and electrically connected to the shielding layer. The interface layer and carrier are removed. An interconnect structure is formed over conductive material, encapsulant, and first die. The conductive material is electrically connected through the interconnect structure to a ground point. The conductive material is singulated to separate the first die. A second semiconductor die can be mounted over the first die such that the shielding layer covers the second die and the conductive material surrounds the second die or the first and second die.

25 Claims, 10 Drawing Sheets

(51) Int. Cl.

| | |
|---|---|
| *H01L 23/31* | (2006.01) |
| *H01L 23/00* | (2006.01) |
| *H01L 25/065* | (2006.01) |
| *H01L 25/11* | (2006.01) |
| *H01L 21/48* | (2006.01) |
| *H01L 23/06* | (2006.01) |
| *H01L 23/10* | (2006.01) |
| *H01L 23/528* | (2006.01) |
| *H01L 23/538* | (2006.01) |
| *H01L 25/10* | (2006.01) |

(52) U.S. Cl.
CPC ............ H01L 24/20 (2013.01); H01L 25/105 (2013.01); H01L 2223/6677 (2013.01); H01L 2224/0217 (2013.01); H01L 2224/02166 (2013.01); H01L 2224/02373 (2013.01); H01L 2224/02381 (2013.01); H01L 2224/0401 (2013.01); H01L 2224/04105 (2013.01); H01L 2224/05548 (2013.01); H01L 2224/05567 (2013.01); H01L 2224/05611 (2013.01); H01L 2224/05624 (2013.01); H01L 2224/05639 (2013.01); H01L 2224/05644 (2013.01); H01L 2224/05647 (2013.01); H01L 2224/05655 (2013.01); H01L 2224/11849 (2013.01); H01L 2224/12105 (2013.01); H01L 2224/13022 (2013.01); H01L 2224/13024 (2013.01); H01L 2224/13027 (2013.01); H01L 2224/13111 (2013.01); H01L 2224/13113 (2013.01); H01L 2224/13116 (2013.01); H01L 2224/13124 (2013.01); H01L 2224/13139 (2013.01); H01L 2224/13144 (2013.01); H01L 2224/13147 (2013.01); H01L 2224/13155 (2013.01); H01L 2224/16225 (2013.01); H01L 2224/20 (2013.01); H01L 2224/215 (2013.01); H01L 2224/221 (2013.01); H01L 2224/73253 (2013.01); H01L 2224/95001 (2013.01); H01L 2224/96 (2013.01); H01L 2225/06524 (2013.01); H01L 2225/06537 (2013.01); H01L 2225/06548 (2013.01); H01L 2225/06551 (2013.01); H01L 2225/06572 (2013.01); H01L 2225/06586 (2013.01); H01L 2924/0002 (2013.01); H01L 2924/00014 (2013.01); H01L 2924/014 (2013.01); H01L 2924/01004 (2013.01); H01L 2924/01005 (2013.01); H01L 2924/01006 (2013.01); H01L 2924/01013 (2013.01); H01L 2924/01023 (2013.01); H01L 2924/01029 (2013.01); H01L 2924/01033 (2013.01); H01L 2924/01047 (2013.01); H01L 2924/01073 (2013.01); H01L 2924/01074 (2013.01); H01L 2924/01078 (2013.01); H01L 2924/01079 (2013.01); H01L 2924/01082 (2013.01); H01L 2924/01322 (2013.01); H01L 2924/09701 (2013.01); H01L 2924/12041 (2013.01); H01L 2924/12042 (2013.01); H01L *2924/1306* (2013.01); *H01L 2924/13091* (2013.01); *H01L 2924/14* (2013.01); *H01L 2924/181* (2013.01)

(56) References Cited

U.S. PATENT DOCUMENTS

| | | |
|---|---|---|
| 5,646,828 A | 7/1997 | Degani et al. |
| 5,841,193 A | 11/1998 | Eichelberger |
| 7,619,901 B2 | 11/2009 | Eichelberger et al. |
| 2004/0150977 A1* | 8/2004 | Hsieh .................. H01L 23/3128 361/818 |
| 2004/0159926 A1* | 8/2004 | Moriwaki ........... H01L 23/3128 257/678 |
| 2004/0179344 A1* | 9/2004 | Uchida ................. H01L 23/055 361/777 |
| 2005/0087356 A1 | 4/2005 | Forcier |
| 2006/0060953 A1 | 3/2006 | Yang et al. |
| 2006/0105496 A1* | 5/2006 | Chen ................ H01L 21/76898 438/106 |
| 2006/0172463 A1* | 8/2006 | Karnezos ........... H01L 23/3128 438/109 |
| 2006/0216857 A1* | 9/2006 | Zhao ....................... H01L 23/13 438/106 |
| 2007/0018333 A1* | 1/2007 | Tsai .................. H01L 23/49816 257/777 |
| 2007/0158796 A1* | 7/2007 | Sawle .................... H01L 21/563 257/675 |
| 2007/0284732 A1* | 12/2007 | Huang ................ H01L 21/4871 257/712 |
| 2007/0290376 A1 | 12/2007 | Zhao et al. |
| 2008/0157300 A1* | 7/2008 | Chuang .............. H01L 23/3121 257/675 |
| 2008/0265383 A1 | 10/2008 | Brunnbauer et al. |
| 2009/0152713 A1* | 6/2009 | Sauciuc ............. H01L 23/3737 257/713 |
| 2009/0186451 A1* | 7/2009 | Teshirogi .............. H01L 21/561 438/119 |
| 2009/0289352 A1* | 11/2009 | Horie .................. H01L 23/3675 257/712 |
| 2009/0294928 A1* | 12/2009 | Kim ...................... H01L 21/561 257/659 |
| 2009/0302435 A1 | 12/2009 | Pagaila et al. |
| 2010/0025847 A1* | 2/2010 | Tomura ................. H01L 21/563 257/737 |
| 2010/0072582 A1 | 3/2010 | Chandra et al. |
| 2010/0072618 A1 | 3/2010 | Camacho et al. |
| 2010/0078777 A1* | 4/2010 | Barth .................... H01L 23/481 257/659 |
| 2010/0078822 A1 | 4/2010 | Bauer et al. |
| 2010/0237477 A1 | 9/2010 | Pagaila et al. |
| 2010/0244172 A1* | 9/2010 | Borthakur ......... H01L 27/14618 257/435 |
| 2011/0031634 A1 | 2/2011 | Pagaila |
| 2011/0248389 A1* | 10/2011 | Yorita ................. H01L 23/3677 257/659 |
| 2012/0008805 A1* | 1/2012 | Hachinohe ............ B81B 7/0064 381/163 |
| 2012/0218729 A1* | 8/2012 | Carey .................. H01L 21/561 361/807 |

\* cited by examiner

US 10,643,952 B2

SEMICONDUCTOR DEVICE AND METHOD OF FORMING EMI SHIELDING LAYER WITH CONDUCTIVE MATERIAL AROUND SEMICONDUCTOR DIE

CLAIM TO DOMESTIC PRIORITY

The present application is a continuation of U.S. patent application Ser. No. 12/792,031, now U.S. Pat. No. 9,484,279, filed Jun. 2, 2010, which application is incorporated herein by reference.

FIELD OF THE INVENTION

The present invention relates in general to semiconductor devices and, more particularly, to a semiconductor device and method of forming an EMI and RFI shielding layer with conductive material around a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk, which can interfere with their operation.

SUMMARY OF THE INVENTION

A need exists to isolate semiconductor die from EMI, RFI, and other inter-device interference. Accordingly, in one embodiment, the present invention is a method of making a semiconductor device comprising the steps of providing a first semiconductor die, depositing an encapsulant around the first semiconductor die, forming a shielding layer over the first semiconductor die, forming a channel through the encapsulant around the first semiconductor die, depositing a conductive material in the channel around the first semiconductor die and electrically connected to the shielding layer, and forming an interconnect structure over the conductive material, encapsulant, and first semiconductor die. The interconnect structure is electrically connected to the conductive material.

In another embodiment, the present invention is a method of making a semiconductor device comprising the steps of providing a first semiconductor die, depositing an encapsulant around the first semiconductor die, forming a shielding layer over the first semiconductor die, and forming a conductive channel through the encapsulant and electrically connected to the shielding layer.

In another embodiment, the present invention is a method of making a semiconductor device comprising the steps of providing a first semiconductor die, forming a shielding layer over the first semiconductor die, and forming a conductive channel around the first semiconductor die and electrically connected to the shielding layer.

In another embodiment, the present invention is a semiconductor device comprising a first semiconductor die and encapsulant deposited around the first semiconductor die. A shielding layer is formed over the first semiconductor die. A conductive channel is formed through the encapsulant and electrically connected to the shielding layer.

DETAILED DESCRIPTION OF THE DRAWINGS

Figure 1:
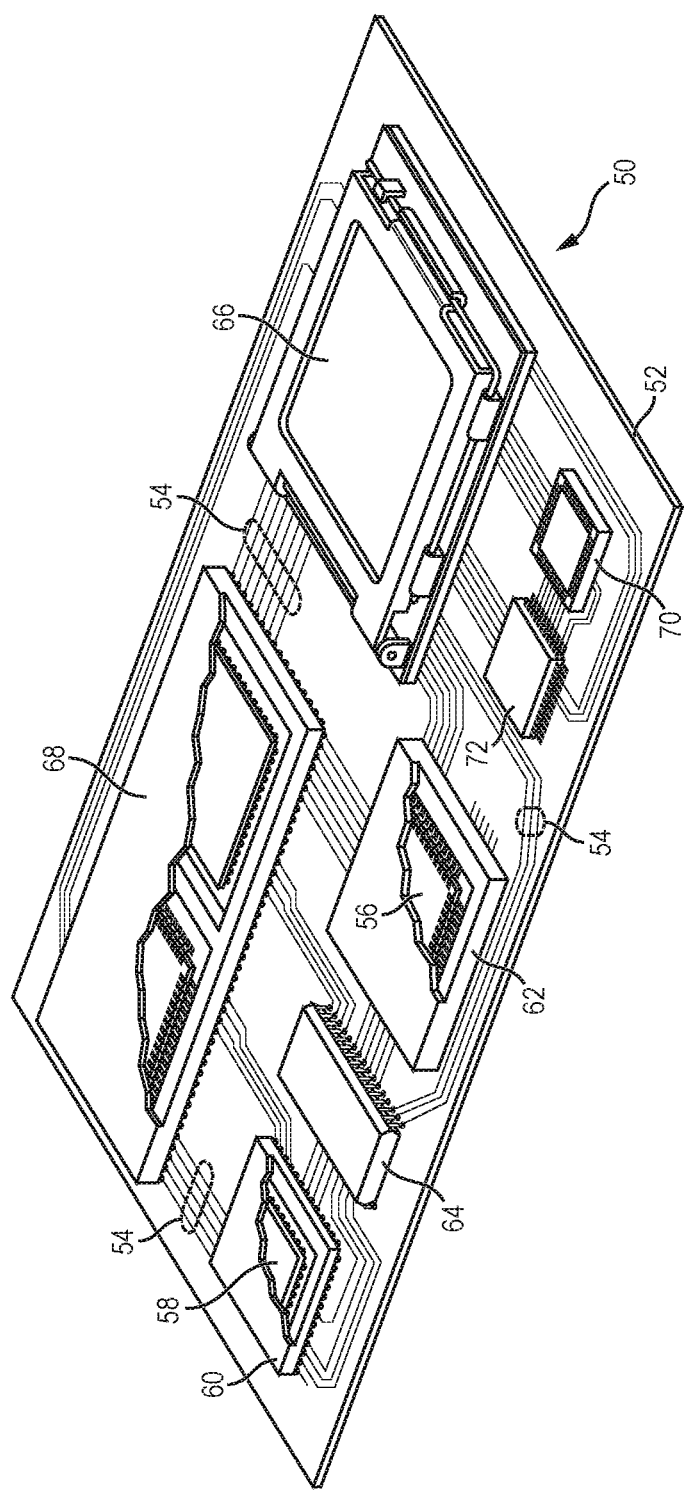
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
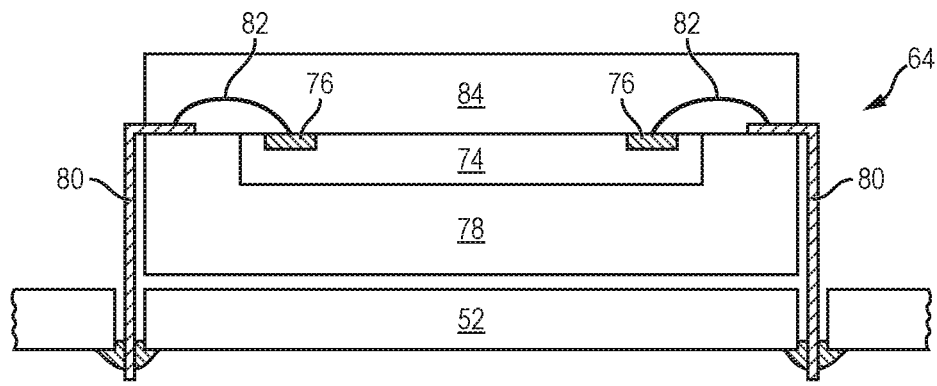
FIGS. 2a-2c illustrate further detail of the representative semiconductor packages mounted to the PCB.
Figure 2B:
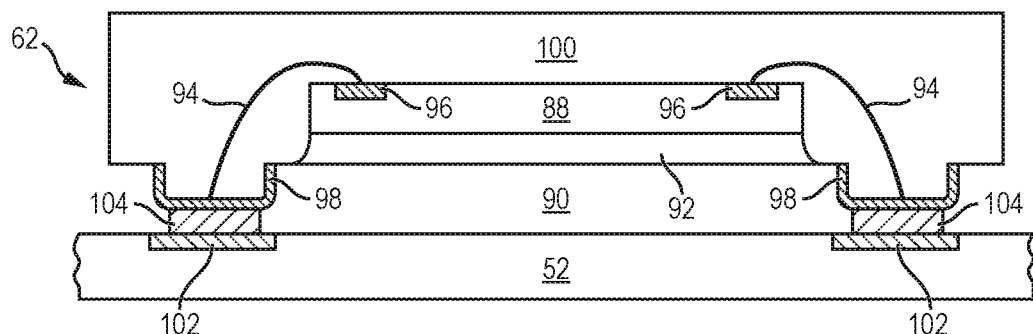
Figure 2C:
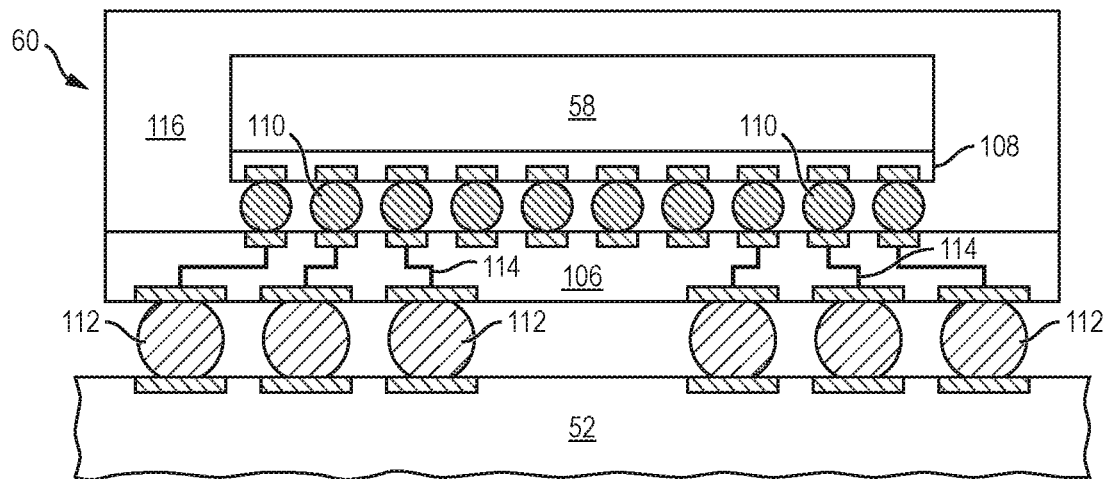

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
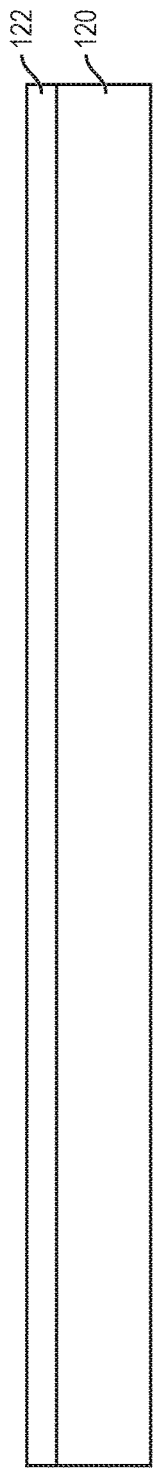
FIGS. 3a-3k illustrate a process of forming an EMI and RFI shielding layer with conductive material around a semiconductor die.

FIGS. 3a-3k illustrate, in relation to FIGS. 1 and 2a-2c, a process of forming an EMI and RFI shielding layer with conductive material around a semiconductor die. In FIG. 3a, a temporary carrier or substrate 120 contains sacrificial base material such as silicon, polymer, polymer composite, metal, ceramic, glass, glass epoxy, beryllium oxide, or other suitable low-cost, rigid material or bulk semiconductor material for structural support. An optional interface layer 122 can be formed over carrier 120 as a temporary adhesive bonding film or etch-stop layer.

Figure 3B:
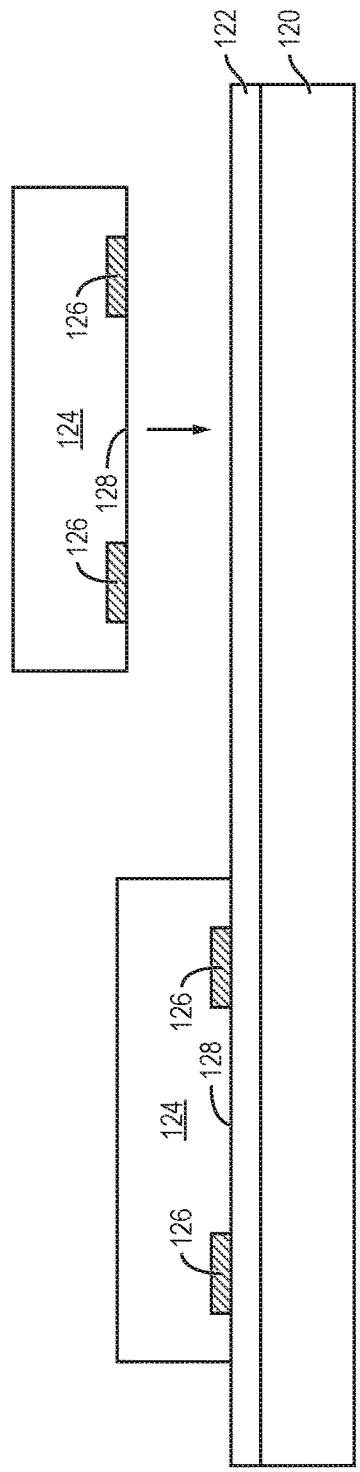
Figure 3C:
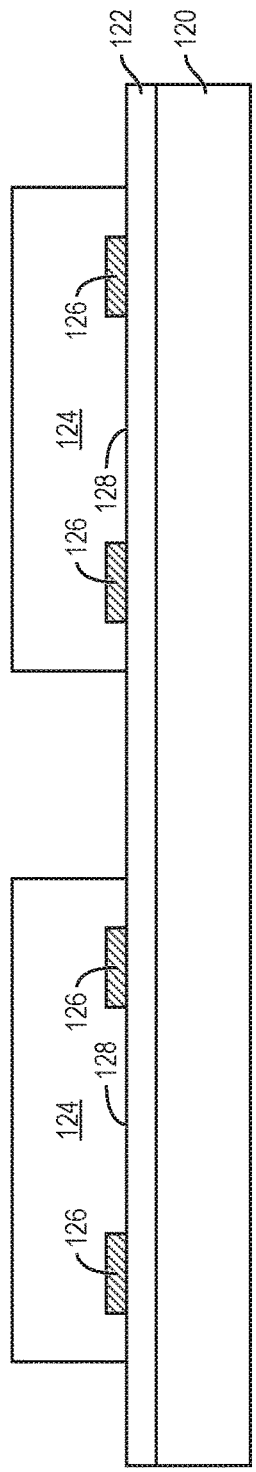

FIG. 3b shows a portion of carrier 120 with a plurality of semiconductor die or components 124 mounted to interface layer 122 using a pick and place operation. Contact pads 126 formed over active surface 128 of semiconductor die 124 are oriented toward carrier 120. Active surface 128 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement analog circuits or digital circuits, such as digital signal processing (DSP), ASIC, memory, or other signal processing circuit. Semiconductor die 124 may also contain IPDs, such as inductors, capacitors, and resistors, for RF signal processing. In one embodiment, semiconductor die 124 is a flipchip type semiconductor die. FIG. 3c shows all semiconductor die 124 with active surface 128 mounted to interface layer 122 over carrier 120.

Figure 3D:
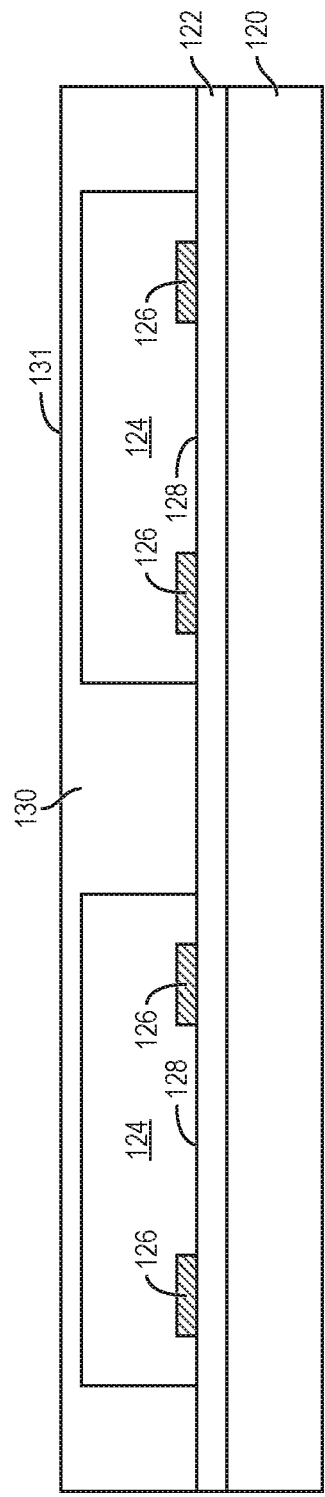

In FIG. 3d, an encapsulant or molding compound 130 is deposited over semiconductor die 124 and carrier 120 using a paste printing, compressive molding, transfer molding, liquid encapsulant molding, vacuum lamination, spin coating, or other suitable applicator. Encapsulant 130 can be polymer composite material, such as epoxy resin with filler, epoxy acrylate with filler, or polymer with proper filler. Encapsulant 130 is non-conductive and environmentally protects the semiconductor device from external elements and contaminants.

Semiconductor die 124 may contain baseband circuits that generate EMI, RFI, or other inter-device interference, such as capacitive, inductive, or conductive coupling. In other embodiments, semiconductor die 124 contain IPDs that are susceptible to EMI, RFI, and inter-device interference. For example, the IPDs contained within semiconductor die 124 provide the electrical characteristics needed for high frequency applications, such as resonators, high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun is dedicated for a frequency band of operation of the quad-band device. A typical RF system requires multiple IPDs and other high frequency circuits in one or more semiconductor packages to perform the necessary electrical functions.

Figure 3E:
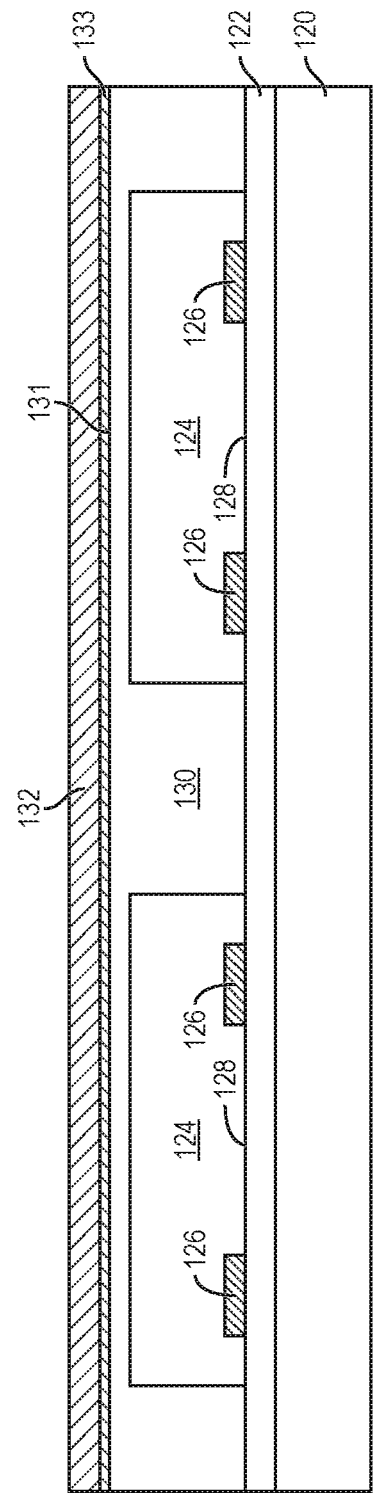

To reduce the effects of EMI and RFI, a shielding layer 132 is conformally deposited over a top surface 131 of encapsulant 130 opposite carrier 120, as shown in FIG. 3e. Shielding layer 132 is substantially flat across top surface 131 of encapsulant 130. An optional seed layer 133 is conformally deposited over top surface 131 of encapsulant 130 prior to forming shielding layer 132. Shielding layer 132 can be Al, ferrite or carbonyl iron, stainless steel, nickel silver, low-carbon steel, silicon-iron steel, foil, conductive resin, and other metals and composites capable of blocking or absorbing EMI, RFI, and other inter-device interference. Shielding layer 132 can also be a non-metal material such as carbon-black or aluminum flake to reduce the effects of EMI and RFI. Seed layer 133 can be made with Cu, Ni, nickel vanadium (NiV), Au, or Al. Shielding layer 132 and seed layer 133 are patterned and conformally deposited using an electrolytic plating, electroless plating, sputtering, PVD, CVD, or other suitable metal deposition process. For non-metal materials, shielding layer 132 can be applied by lamination, spraying, or painting.

Figure 3F:
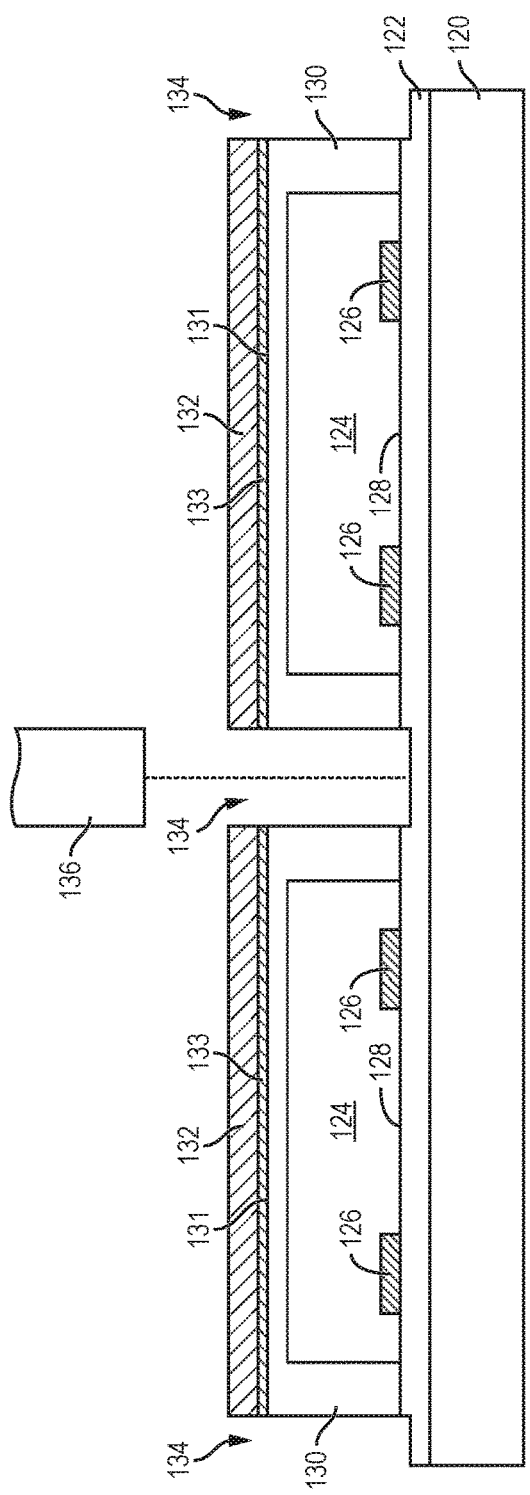
Figure 3G:
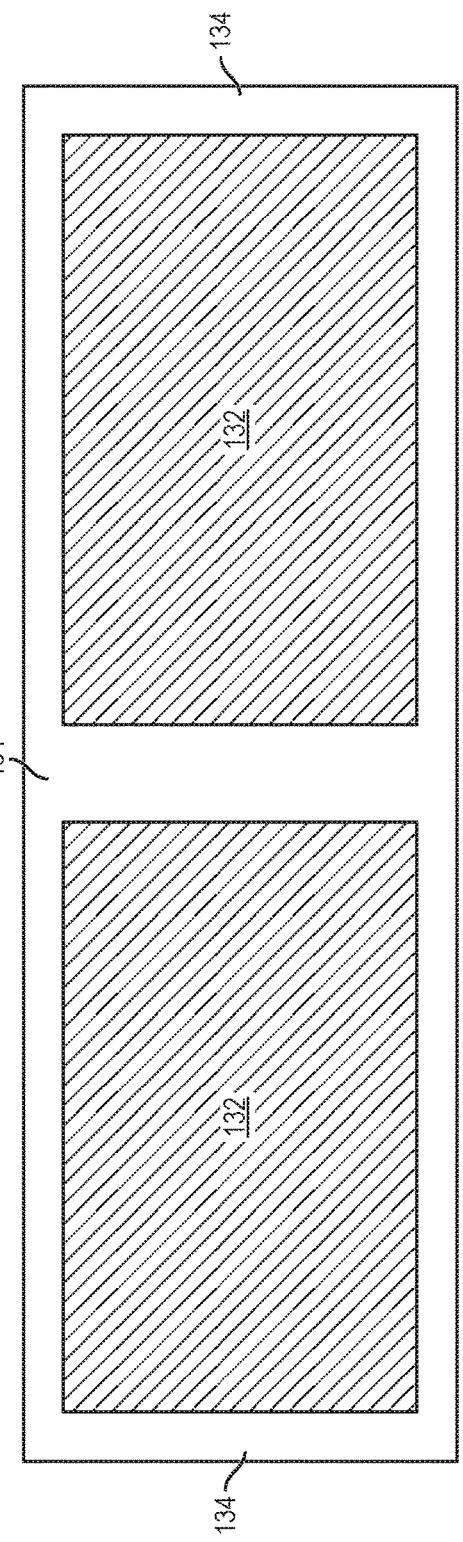

In FIG. 3f, a channel 134 is cut through shielding layer 132 and encapsulant 130 between semiconductor die 124 using saw blade or laser cutting tool 136. Channel 134 extends down only as far as a top surface of interface layer 122 (boundary between encapsulant 130 and interface structure 150) or partially into interface layer 122. Channel 134 is formed completely around semiconductor die 124, as shown in FIG. 3g.

Figure 3H:
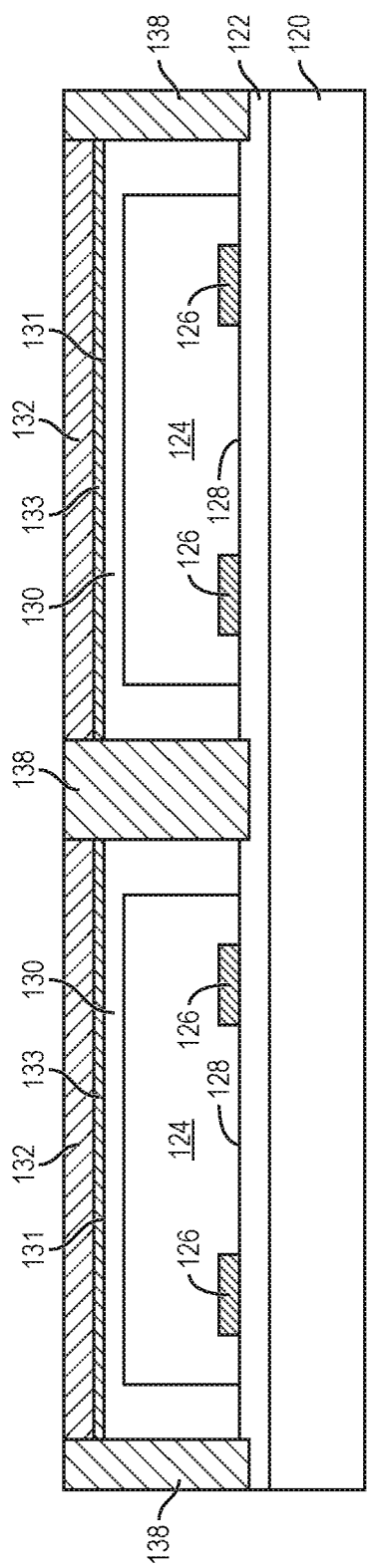

In FIG. 3h, conductive material 138 is deposited into channel 134 up to a level of shielding layer 132. Conductive material 138 can be molten solder, copper, or conductive polymer. Conductive material 138 constitutes a side portion of the EMI shielding extending completely around semiconductor die 124. Conductive material 138 is electrically connected to shielding layer 132.

Figure 3I:
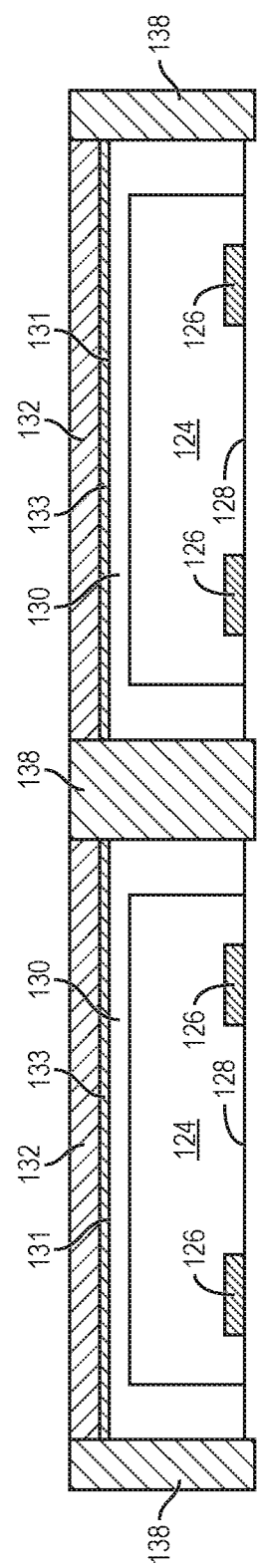

In FIG. 3i, temporary carrier 120 and interface layer 122 are removed by chemical etching, mechanical peel-off, CMP, mechanical grinding, thermal bake, laser scanning, or wet stripping. A portion of conductive material 138 is exposed from or extends beyond encapsulant 130.

Figure 3J:
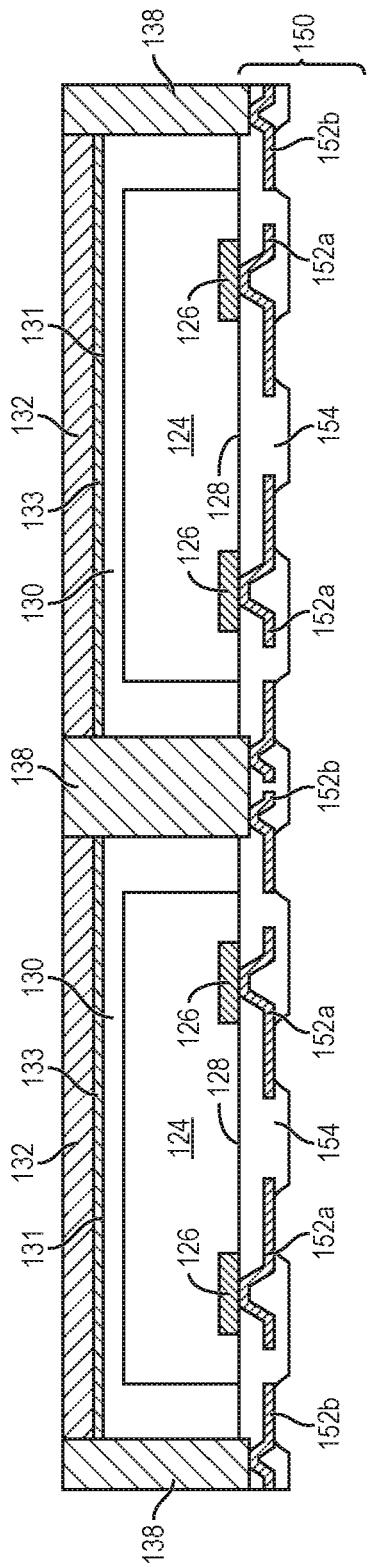

In FIG. 3j, a build-up interconnect structure 150 is formed over encapsulant 130 and active surface 128 of semiconductor die 124. The build-up interconnect structure 150 includes an electrically conductive layer or redistribution layer (RDL) 152 formed using a patterning and metal deposition process such as sputtering, electrolytic plating, and electroless plating. Conductive layer 152 can be one or more layers of Al, Cu, Sn, Ni, Au, Ag, or other suitable electrically conductive material. Conductive layer 152a is electrically connected to contact pads 126 for routing signals. Conductive layer 152b is electrically connected to conductive material 138 as a low impedance ground point. Other portions of conductive layer 152 can be electrically common or electrically isolated depending on the design and function of semiconductor die 124.

The build-up interconnect structure 150 further includes an insulating or passivation layer 154 formed between conductive layers 152 for electrical isolation. The insulating layer 154 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 154 is formed using PVD, CVD, printing, spin coating, spray coating, sintering or thermal oxidation. A portion of insulating layer 154 is removed by an etching process to expose conductive layer 152 for bump formation or additional package interconnect.

Figure 3K:
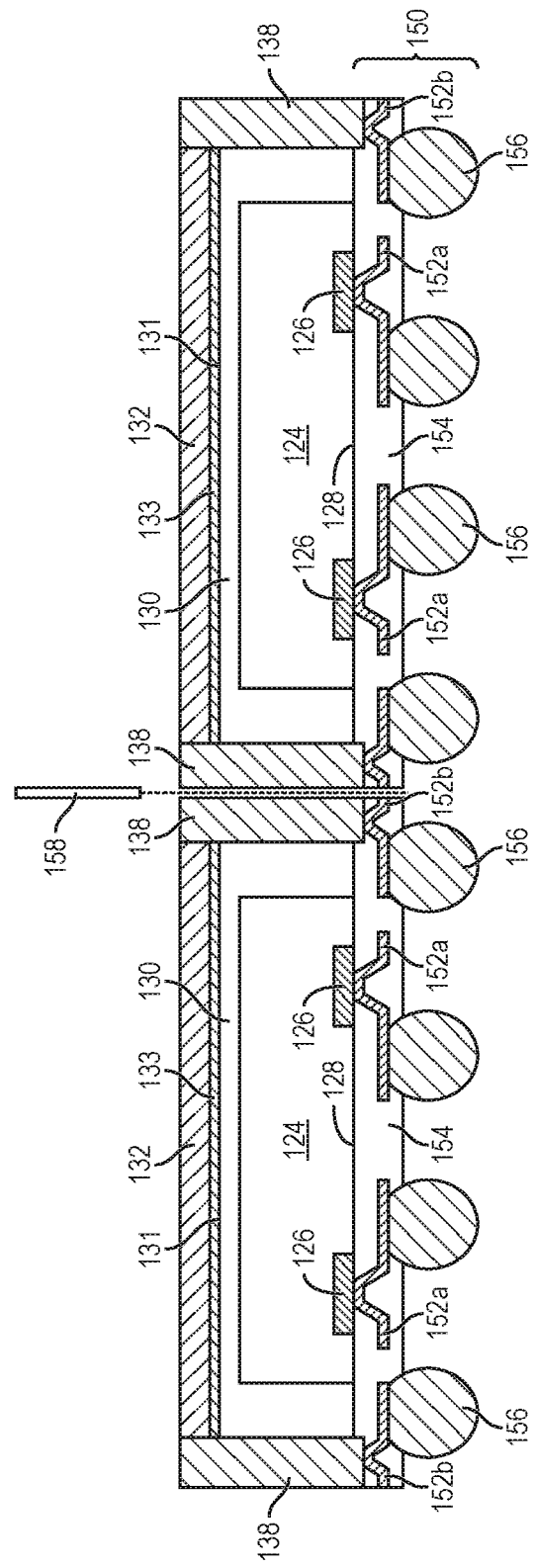

In FIG. 3k, an electrically conductive bump material is deposited over build-up interconnect structure 150 and electrically connected to conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form spherical balls or bumps 156. In some applications, bumps 156 are reflowed a second time to improve electrical contact to conductive layer 152. An under bump metallization (UBM) can be formed under bumps 156. The bumps can also be compression bonded to conductive layer 152. Bumps 156 represent one type of interconnect structure that can be formed over conductive layer 152. The interconnect structure can also use bond wires, stud bump, micro bump, or other electrical interconnect.

The semiconductor device shown in FIG. 3k is singulated through conductive material 138 using saw blade or laser cutting tool 158 to separate individual semiconductor die 124.

Figure 4:
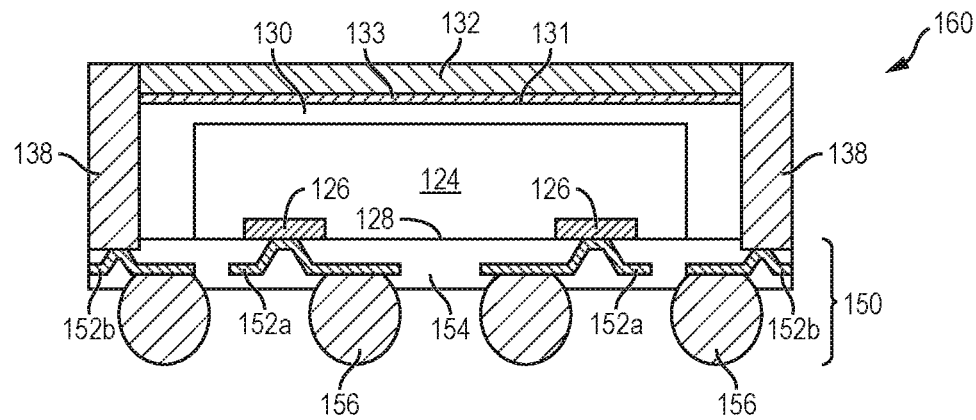
FIG. 4 illustrates the FO-WLCSP with shielding layer and conductive material formed around the semiconductor die.

FIG. 4 shows FO-WLCSP 160 after singulation. Semiconductor die 124 is electrically connected to conductive layer 152a of interconnect structures 150 and bumps 156. The flat shielding layer 132 is readily formed over encapsulant 130 to block or absorb EMI, RFI, and other inter-device interference. Conductive material 138 provides EMI coverage around the sides of semiconductor die 124 and routes EMI, RFI, and other interfering signals through conductive layer 152b and bumps 156 to an external low-impedance ground point. Accordingly, the flat shielding layer 132 and conductive material 138 provide effective EMI and RFI shielding for the top and sides of semiconductor die 124.

Figure 5:
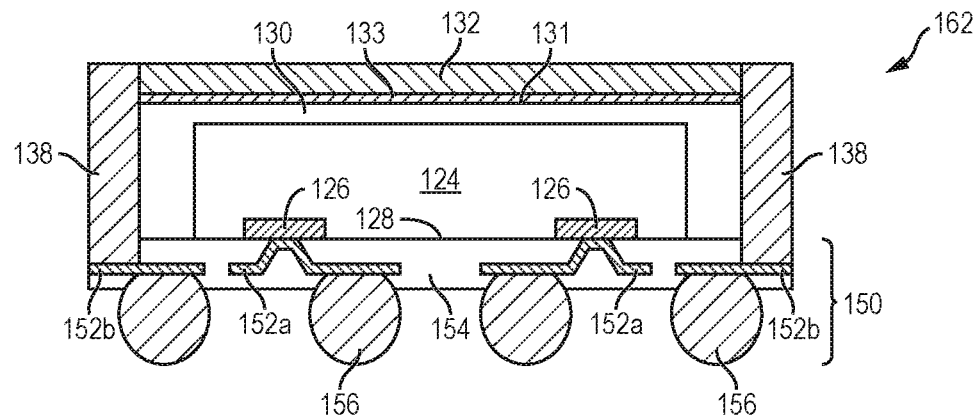
FIG. 5 illustrates the conductive material extending down to a horizontal conductive layer in the interconnect structure.

FIG. 5 shows an embodiment of FO-WLCSP 162, similar to FIG. 4, with conductive material 138 protruding or extending into insulating layer 154 of interconnect structure 150 to contact a substantially horizontal conductive layer 152b. Conductive material 138, conductive layer 152b, and bumps 156 route EMI, RFI, and other interfering signals from shielding layer 132 to an external low-impedance ground point.

Figure 6:
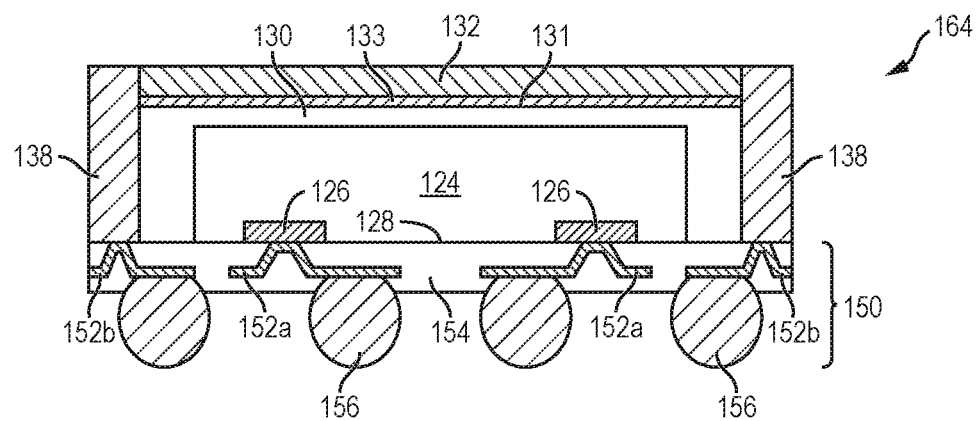
FIG. 6 illustrates the conductive material terminating at and exposed from the encapsulant.

FIG. 6 shows an embodiment of FO-WLCSP 164, similar to FIG. 4, with conductive material 138 terminating at but exposed from the boundary of encapsulant 130 and interconnect structure 150, i.e., no protrusion or extension of conductive material 138 into interconnect structure 150. A vertical portion of conductive layer 152b extends to a top surface of interconnect structure 150 to contact conductive material 138. Conductive material 138, conductive layer 152b, and bumps 156 route EMI, RFI, and other interfering signals from shielding layer 132 to an external low-impedance ground point.

Figure 7:
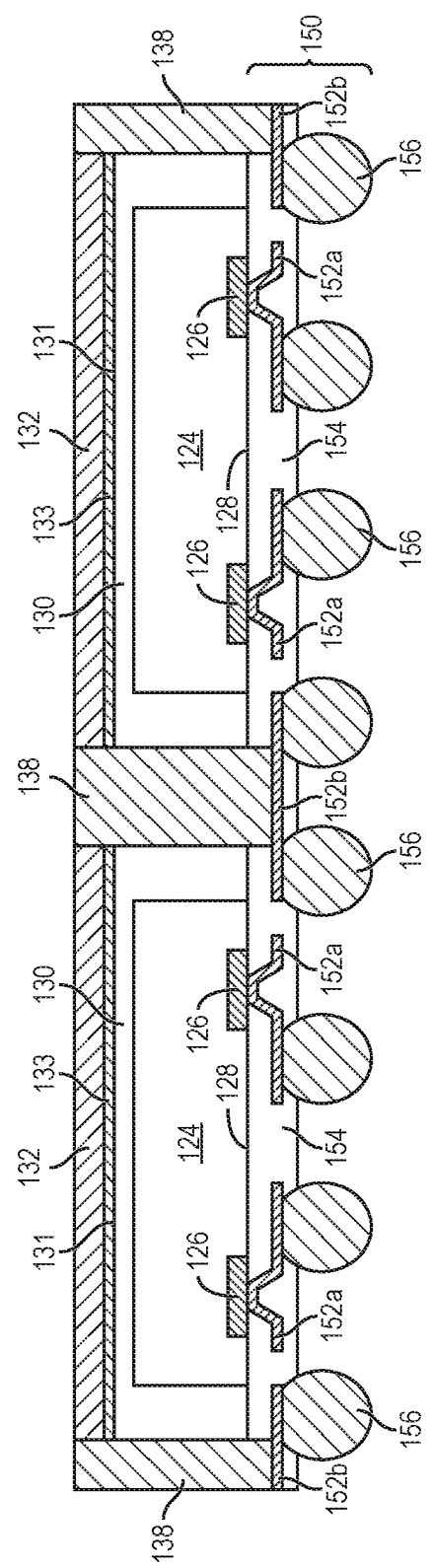
FIG. 7 illustrates side-by-side semiconductor die each covered by the shielding layer and surrounded by the conductive material.

FIG. 7 shows an embodiment of FO-WLCSP 166, similar to FIG. 4, with side-by-side semiconductor die 124 each covered by shielding layer 132 and surrounded by conductive material 138.

Figure 8:
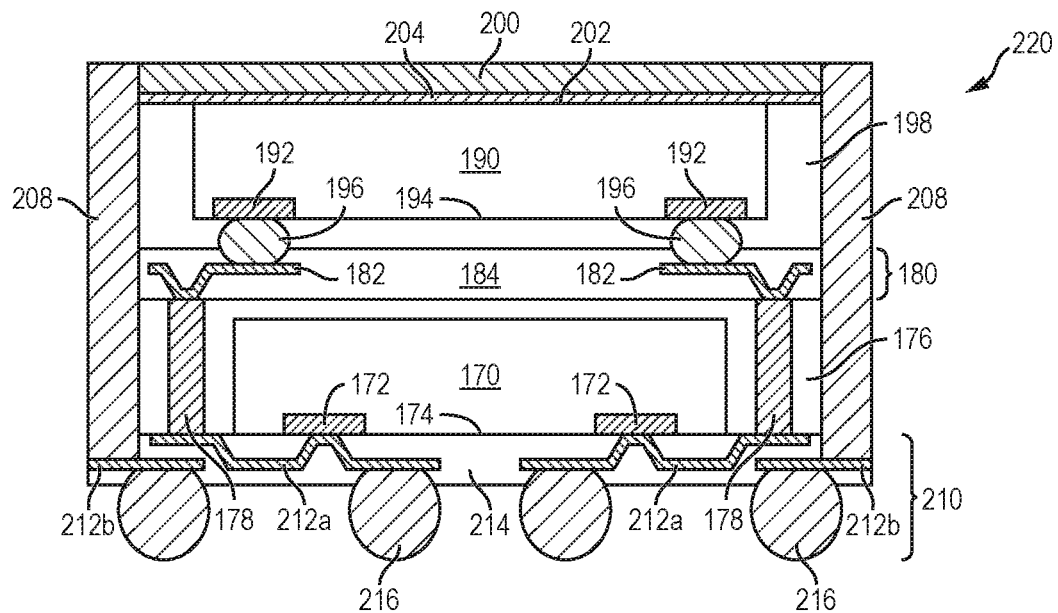
FIG. 8 illustrates another embodiment with the shielding layer and conductive material formed around stacked semiconductor die.

FIG. 8 shows another embodiment with semiconductor die 170 having contact pads 172 formed over active surface 174 which contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 174 to implement analog circuits or digital circuits, such as DSP, ASIC, memory, or other signal processing circuit. Semiconductor die 170 may also contain IPDs, such as inductors, capacitors, and resistors, for RF signal processing. In one embodiment, semiconductor die 170 is a flipchip type semiconductor die. Semiconductor die 170 is mounted to an interface layer formed over a temporary carrier.

An encapsulant or molding compound 176 is deposited over semiconductor die 170 using a paste printing, compressive molding, transfer molding, liquid encapsulant molding, vacuum lamination, spin coating, or other suitable applicator. Encapsulant 176 can be polymer composite material, such as epoxy resin with filler, epoxy acrylate with filler, or polymer with proper filler. Encapsulant 176 is non-conductive and environmentally protects the semiconductor device from external elements and contaminants.

A plurality of vias is formed through encapsulant 176 around a periphery of semiconductor die 170 using mechanical drilling, laser drilling, or deep reactive ion etching (DRIE). The vias are filled with Al, Cu, Sn, Ni, Au, Ag, Ti, tungsten (W), poly-silicon, or other suitable electrically conductive material using electrolytic plating, electroless plating process, or other suitable metal deposition process to form conductive pillars or vias 178. Alternatively, a plurality of stud bumps or solder balls can be formed within the vias.

A build-up interconnect structure 180 is formed over encapsulant 176. The build-up interconnect structure 180 includes an electrically conductive layer or RDL 182 formed using a patterning and metal deposition process such as sputtering, electrolytic plating, and electroless plating. Conductive layer 182 can be one or more layers of Al, Cu, Sn, Ni, Au, Ag, or other suitable electrically conductive material. A portion of conductive layer 182 is electrically connected to conductive pillars or vias 178 for routing signals. Other portions of conductive layer 182 can be electrically common or electrically isolated depending on the design and function of semiconductor die 124.

The build-up interconnect structure 180 further includes an insulating or passivation layer 184 formed between conductive layers 182 for electrical isolation. The insulating layer 184 contains one or more layers of $SiO_2$, $Si_3N_4$, SiON, $Ta_2O_5$, $Al_2O_3$, or other material having similar insulating and structural properties. The insulating layer 184 is formed using PVD, CVD, printing, spin coating, spray coating, sintering or thermal oxidation. A portion of insulating layer 184 is removed by an etching process to expose conductive layer 182.

A semiconductor die 190 has contact pads 192 formed over active surface 194 which contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 194 to implement analog circuits or digital circuits, such as DSP, ASIC, memory, or other signal processing circuit. Semiconductor die 190 may also contain IPDs, such as inductors, capacitors, and resistors, for RF signal processing. In one embodiment, semiconductor die 190 is a flipchip type semiconductor die. A plurality of bumps 196 is formed over contact pads 192. Semiconductor die 190 is mounted to interconnect structure 180 and electrically connected to conductive layer 182 with bumps 196.

An encapsulant or molding compound 198 is deposited over semiconductor die 190 and interconnect structure 180 using a paste printing, compressive molding, transfer molding, liquid encapsulant molding, vacuum lamination, spin coating, or other suitable applicator. Encapsulant 198 can be polymer composite material, such as epoxy resin with filler, epoxy acrylate with filler, or polymer with proper filler. Encapsulant 198 is non-conductive and environmentally protects the semiconductor device from external elements and contaminants.

Semiconductor die 170 and/or semiconductor die 190 may contain baseband circuits that generate EMI, RFI, or other inter-device interference, such as capacitive, inductive, or conductive coupling. In other embodiments, semiconductor die 170 and/or 190 contain IPD that are susceptible to EMI, RFI, and inter-device interference. For example, the IPDs contained within semiconductor die 170 and/or 190 provide the electrical characteristics needed for high frequency applications, such as resonators, high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other GSM communications, each balun is dedicated for a frequency band of operation of the quad-band device. A typical RF system requires multiple IPDs and other high frequency circuits in one or more semiconductor packages to perform the necessary electrical functions.

To reduce the effects of EMI and RFI, a shielding layer 200 is conformally deposited over encapsulant 198 and top surface 202 of semiconductor die 190. Shielding layer 200 is substantially flat across encapsulant 198 and top surface 202 of semiconductor die 190. An optional seed layer 204 is conformally deposited over encapsulant 198 and top surface 202 of semiconductor die 190 prior to forming shielding layer 200. Shielding layer 200 can be Al, ferrite or carbonyl iron, stainless steel, nickel silver, low-carbon steel, silicon-iron steel, foil, conductive resin, and other metals and composites capable of blocking or absorbing EMI, RFI, and other inter-device interference. Shielding layer 200 can also be a non-metal material such as carbon-black or aluminum flake to reduce the effects of EMI and RFI. Seed layer 204 can be made with Cu, Ni, NiV, Au, or Al. Shielding layer 200 and seed layer 204 are patterned and conformally deposited using an electrolytic plating, electroless plating, sputtering, PVD, CVD, or other suitable metal deposition process. For non-metal materials, shielding layer 200 can be applied by lamination, spraying, or painting.

A channel is cut through shielding layer 200, encapsulant 198, interconnect structure 180, and encapsulant 176 using a saw blade or laser cutting tool. The channel extends down only as far as a top surface of the interface layer (boundary between encapsulant 176 and interface structure 210) or partially into the interface layer. The channel is formed completely around semiconductor die 170 and 190.

A conductive material 208 is deposited into the channel up to a level of shielding layer 200. Conductive material 208 can be molten solder, copper, or conductive polymer. Conductive material 208 constitutes a side portion of the EMI shielding extending completely around semiconductor die 170 and 190. Conductive material 208 is electrically connected to shielding layer 200.

The temporary carrier and interface layer are removed by chemical etching, mechanical peel-off, CMP, mechanical grinding, thermal bake, laser scanning, or wet stripping. A portion of conductive material 208 is exposed from or extends beyond encapsulant 176.

A build-up interconnect structure 210 is formed over encapsulant 176 and active surface 174 of semiconductor die 170. The build-up interconnect structure 210 includes an electrically conductive layer or RDL 212 formed using a patterning and metal deposition process such as sputtering, electrolytic plating, and electroless plating. Conductive layer 212 can be one or more layers of Al, Cu, Sn, Ni, Au, Ag, or other suitable electrically conductive material. Conductive layer 212a is electrically connected to contact pads 172 for routing signals. Conductive layer 212b is electrically connected to conductive material 208 as a low-impedance ground point. Other portions of conductive layer 212 can be electrically common or electrically isolated depending on the design and function of semiconductor die 170 and 190.

The build-up interconnect structure 210 further includes an insulating or passivation layer 214 formed between conductive layers 212 for electrical isolation. The insulating layer 214 contains one or more layers of SiO2, Si3N4, SiON, Ta2O5, Al2O3, or other material having similar insulating and structural properties. The insulating layer 214 is formed using PVD, CVD, printing, spin coating, spray coating, sintering or thermal oxidation. A portion of insulating layer 214 is removed by an etching process to expose conductive layer 212 for bump formation or additional package interconnect.

An electrically conductive bump material is deposited over build-up interconnect structure 210 and electrically connected to conductive layer 212 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 212 using a suitable attachment or bonding process. In one embodiment, the bump material is reflowed by heating the material above its melting point to form spherical balls or bumps 216. In some applications, bumps 216 are reflowed a second time to improve electrical contact to conductive layer 212. A UBM can be formed under bumps 216. The bumps can also be compression bonded to conductive layer 212. Bumps 216 represent one type of interconnect structure that can be formed over conductive layer 212. The interconnect structure can also use bond wires, stud bump, micro bump, or other electrical interconnect.

In FO-WLCSP 220, semiconductor die 170 is electrically connected to conductive layer 212a of interconnect structures 210 and bumps 216. Semiconductor die 190 is electrically connected through bumps 196, conductive layer 182, conductive pillars or vias 178, and conductive layer 212 to semiconductor die 170 and bumps 216. The flat shielding layer 200 is readily formed over semiconductor die 170 and 190 to block or absorb EMI, RFI, and other inter-device interference. Conductive material 208 provides EMI and RFI shielding around the sides of semiconductor die 170 and 190 and routes EMI, RFI, and other interfering signals through conductive layer 212b and bumps 216 to an external low-impedance ground point. Accordingly, the flat shielding layer 200 and conductive material 208 provides effective EMI and RFI shielding for the top and sides of semiconductor die 170 and 190.

Figure 9:
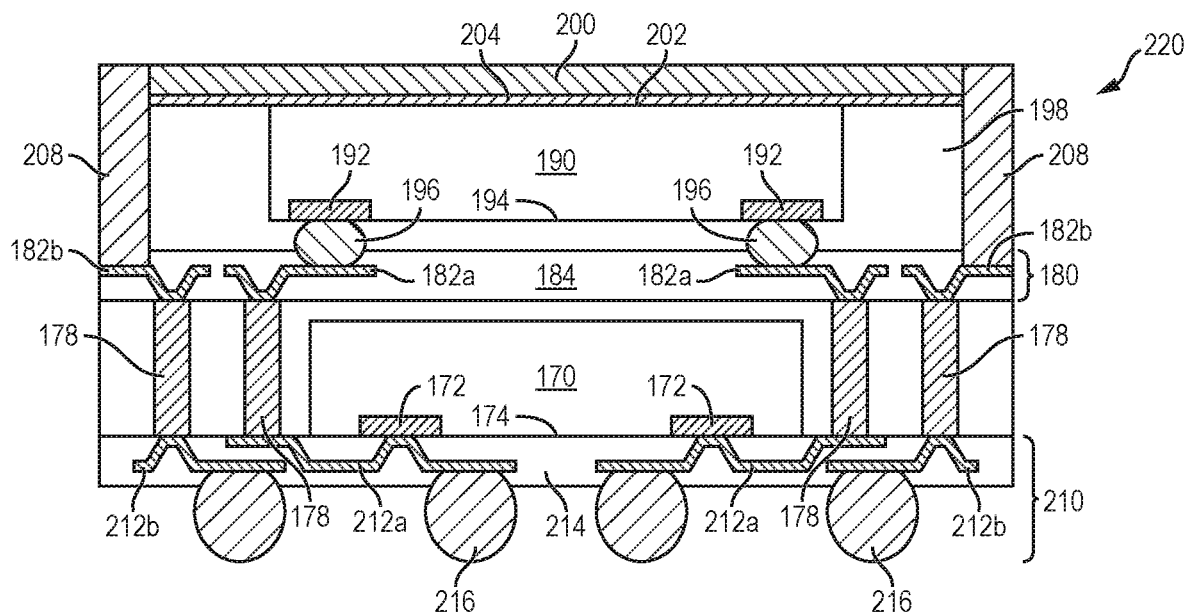
FIG. 9 illustrates the conductive material terminating around the upper semiconductor die.

FIG. 9 shows an embodiment similar to FIG. 7 with conductive material 208 formed only around encapsulant 198 and semiconductor die 190. Conductive material 208 terminates at interconnect structure 180. Shielding layer 200 and conductive material 208 are grounded through conductive layer 182b, conductive pillars or vias 178, conductive layer 212, and bumps 216.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first semiconductor die;
   depositing an encapsulant around the first semiconductor die, wherein a bottom surface of the encapsulant is coplanar with an active surface of the first semiconductor die;
   forming a shielding layer over the first semiconductor die, wherein a side surface of the shielding layer is coplanar with a side surface of the encapsulant;

forming a conductive channel comprising a solder material through the encapsulant along a side surface of the first semiconductor die and physically contacting the shielding layer and encapsulant, wherein a side surface of the conductive channel is exposed from the semiconductor device for an entire height of the conductive channel;

disposing a second semiconductor die over the first semiconductor die; and forming a first interconnect structure between the first semiconductor die and second semiconductor die, wherein a side surface of the first interconnect structure contacts the conductive channel and the first semiconductor die is electrically coupled to the second semiconductor die through the first interconnect structure.

2. The method of claim 1, wherein the conductive channel extends around the first semiconductor die.

3. The method of claim 1, further including forming a second interconnect structure over the conductive channel, encapsulant, and first semiconductor die, wherein the second interconnect structure is electrically connected to the conductive channel.

4. The method of claim 3, wherein the conductive channel extends into the second interconnect structure.

5. The method of claim 3, wherein the conductive channel terminates at a boundary between the encapsulant and second interconnect structure.

6. The method of claim 1, wherein the conductive channel extends around the second semiconductor die.

7. A method of making a semiconductor device, comprising:

providing a first semiconductor die;

depositing an encapsulant around the first semiconductor die;

forming a shielding layer over the first semiconductor die and encapsulant;

forming a conductive channel comprising a conductive polymer around a side surface of the first semiconductor die and extending through the encapsulant continuously around the semiconductor die, wherein the conductive channel is electrically connected to the shielding layer;

disposing a second semiconductor die over the first semiconductor die; and forming a first interconnect structure between the first semiconductor die and second semiconductor die, wherein a side surface of the first interconnect structure contacts the conductive channel and the first semiconductor die is electrically coupled to the second semiconductor die through the first interconnect structure.

8. The method of claim 7, further including depositing an encapsulant around the first semiconductor die, wherein the conductive channel extends through the encapsulant.

9. The method of claim 8, further including forming a second interconnect structure over the conductive channel, encapsulant, and first semiconductor die, wherein the second interconnect structure is electrically connected to the conductive channel.

10. The method of claim 9, wherein the conductive channel extends into the second interconnect structure.

11. The method of claim 9, wherein the conductive channel terminates at a boundary between the encapsulant and second interconnect structure.

12. A semiconductor device, comprising:

a first semiconductor die;

an encapsulant deposited around the first semiconductor die, wherein a bottom surface of the encapsulant is coplanar with an active surface of the first semiconductor die;

a shielding layer formed over the first semiconductor die, wherein a side surface of the shielding layer is coplanar with a side surface of the encapsulant;

a conductive channel comprising a solder material formed through the encapsulant along a side surface of the first semiconductor die and physically contacting the shielding layer and encapsulant, wherein a side surface of the conductive channel is exposed from the semiconductor device for an entire height of the conductive channel;

a second semiconductor die disposed over the first semiconductor die; and a first interconnect structure formed between the first semiconductor die and second semiconductor die, wherein a side surface of the first interconnect structure contacts the conductive channel and the first semiconductor die is electrically coupled to the second semiconductor die through the first interconnect structure.

13. The semiconductor device of claim 12, further including a second interconnect structure formed over the conductive channel, encapsulant, and first semiconductor die, wherein the second interconnect structure is electrically connected to the conductive channel and a side surface of the second interconnect structure is coplanar with the side surface of the conductive channel.

14. The semiconductor device of claim 13, wherein the conductive channel extends only part way through the second interconnect structure.

15. The semiconductor device of claim 13, wherein the conductive channel terminates at a boundary between the encapsulant and second interconnect structure.

16. A semiconductor device, comprising:

a first semiconductor die;

an encapsulant deposited around the first semiconductor die;

a shielding layer formed over the first semiconductor die and encapsulant;

a conductive channel comprising a conductive polymer formed around a side surface of the first semiconductor die and extending through the encapsulant continuously around the semiconductor die, wherein the conductive channel is electrically connected to the shielding layer;

a second semiconductor die disposed over the first semiconductor die; and a first interconnect structure formed between the first semiconductor die and second semiconductor die, wherein a side surface of the first interconnect structure contacts the conductive channel and the first semiconductor die is electrically coupled to the second semiconductor die through the first interconnect structure.

17. The semiconductor device of claim 16, further including a second interconnect structure formed over the conductive channel, encapsulant, and first semiconductor die, wherein the second interconnect structure includes a first insulating layer, a conductive layer formed over the first insulating layer, and a second insulating layer formed over the conductive layer.

18. The semiconductor device of claim 17, wherein the conductive channel physically contacts the conductive layer of the second interconnect structure.

19. The semiconductor device of claim 17, wherein the conductive channel terminates at a boundary between the encapsulant and second interconnect structure.

20. The semiconductor device of claim 16, wherein a bottom surface of the encapsulant is coplanar with an active surface of the first semiconductor die, and wherein a side surface of the shielding layer is coplanar with a side surface of the encapsulant.

21. A semiconductor device, comprising:
a first semiconductor die;
an encapsulant deposited around the first semiconductor die;
a shielding layer formed over the first semiconductor die;
a conductive channel comprising a solder material formed through the encapsulant along a side surface of the first semiconductor die and electrically connected to the shielding layer, wherein a side surface of the conductive channel is exposed from the semiconductor device for an entire height of the conductive channel;
a second semiconductor die disposed over the first semiconductor die; and
a first interconnect structure formed between the first semiconductor die and second semiconductor die, wherein a side surface of the first interconnect structure contacts the conductive channel and the first semiconductor die is electrically coupled to the second semiconductor die through the first interconnect structure.

22. The semiconductor device of claim 21, further including a second interconnect structure formed over the conductive channel, encapsulant, and first semiconductor die, wherein the second interconnect structure is electrically connected to the conductive channel.

23. The semiconductor device of claim 22, wherein the conductive channel extends into the second interconnect structure.

24. The semiconductor device of claim 22, wherein the conductive channel terminates at a boundary between the encapsulant and second interconnect structure.

25. The semiconductor device of claim 21, wherein the conductive channel extends around the first semiconductor die.

* * * * *